(12) United States Patent
Takeyasu et al.

(10) Patent No.: US 9,869,034 B2
(45) Date of Patent: Jan. 16, 2018

(54) SILICON SINGLE CRYSTAL PULLING APPARATUS COMPRISING A VERTICALLY MOVABLE SUPPORTING MEMBER HOLDING THE HEATER AND SHIELD

(71) Applicant: SHIN-ETSU HANDOTAI CO., LTD., Tokyo (JP)

(72) Inventors: Shinobu Takeyasu, Echizen (JP); Atsushi Iwasaki, Echizen (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 68 days.

(21) Appl. No.: 14/916,760

(22) PCT Filed: Sep. 1, 2014

(86) PCT No.: PCT/JP2014/004457
§ 371 (c)(1),
(2) Date: Mar. 4, 2016

(87) PCT Pub. No.: WO2015/063992
PCT Pub. Date: May 7, 2015

(65) Prior Publication Data
US 2016/0194783 A1  Jul. 7, 2016

(30) Foreign Application Priority Data

Oct. 29, 2013  (JP) ................ 2013-223999

(51) Int. Cl.
*C30B 15/14* (2006.01)
*C30B 29/06* (2006.01)
*C30B 15/20* (2006.01)

(52) U.S. Cl.
CPC ............ *C30B 15/14* (2013.01); *C30B 15/206* (2013.01); *C30B 29/06* (2013.01)

(58) Field of Classification Search
CPC ......... C30B 15/00; C30B 15/14; C30B 15/20; C30B 15/206; C30B 29/00; C30B 29/02;
(Continued)

(56) References Cited

U.S. PATENT DOCUMENTS 3,337,303 A  8/1967  Lorenzini
5,330,729 A  7/1994  Oda et al.

FOREIGN PATENT DOCUMENTS

CN  101532172 A  9/2009
JP  02-293390  *  4/1990
(Continued)

OTHER PUBLICATIONS

May 3, 2016 International Preliminary Report on Patentability issued in International Patent Application No. PCT/JP2014/004457.
(Continued)

*Primary Examiner* — Kenneth A Bratland, Jr.
(74) *Attorney, Agent, or Firm* — Oliff PLC

(57) ABSTRACT

The present invention is a silicon single crystal pulling apparatus based on Czochralski method, including a crucible for receiving a raw material, a heater for heating the raw material into a raw material melt, a main chamber accommodating the crucible and the heater, a shield disposed between the heater and the main chamber for shielding a radiant heat from the heater, and a supporting member holding the heater and the shield from below, the supporting member being movable vertically whereby the heater and the shield can move vertically together. As a result, there is provided a silicon single crystal pulling apparatus that facilitates the adjustment of thermal history, the improvement of pulling rate of a silicon single crystal, and the reduction in oxygen concentration.

2 Claims, 4 Drawing Sheets

(58) Field of Classification Search
CPC ...... C30B 29/06; Y10T 117/00; Y10T 117/10;
Y10T 117/1004; Y10T 117/1008; Y10T
117/1016; Y10T 117/1024; Y10T
117/1032; Y10T 117/1068
USPC ...... 117/11, 13–15, 200–202, 204, 206, 208,
117/217, 928, 931–932
See application file for complete search history.

(56) References Cited

FOREIGN PATENT DOCUMENTS

| JP | H02-293390 A | 12/1990 |
| JP | H03-5394 A | 1/1991 |
| JP | H07-69778 A | 3/1995 |
| JP | 2002-326888 A | 11/2002 |
| JP | 2012-240861 A | 12/2012 |

OTHER PUBLICATIONS

Dec. 2, 2014 Search Report issued in International Patent Application No. PCT/JP2014/004457.
Mar. 8, 2016 Office Action issued in Japanese Patent Application No. 2013-223999.
Jun. 5, 2017 Office Action issued in Chinese Patent Application No. 201480050778.1.

\* cited by examiner

SILICON SINGLE CRYSTAL PULLING APPARATUS COMPRISING A VERTICALLY MOVABLE SUPPORTING MEMBER HOLDING THE HEATER AND SHIELD

TECHNICAL FIELD

The present invention relates to a silicon single crystal pulling apparatus for pulling a silicon single crystal from a silicon melt based on Czochralski method (CZ method).

BACKGROUND ART

Conventionally, a silicon single crystal is mainly manufactured by the CZ method. In the CZ method, first, silicon polycrystalline raw materials are put into a quartz crucible and heated with a graphite heater to melt the raw materials. A seed crystal attached to a lower end of a superior axis is immersed in the resulting melt and then slowly pulled while rotating the superior axis, thereby growing a silicon single crystal. An apparatus for growing a silicon single crystal in this manner is referred to as a silicon single crystal pulling apparatus.

In the silicon single crystal pulling apparatus, since a melt surface within the quartz crucible sinks with pulling of a silicon single crystal, the crucible is elevated by the decrease in the melt surface to keep height position of the melt surface constant. It is necessary for pulling a silicon single crystal having a certain diameter to control pulling rate of the silicon single crystal and temperature of the melt while measuring the diameter during pulling such that the diameter is kept constant and to elevate the crucible at a predetermined ratio relative to the pulling rate.

In addition, the conventional silicon single crystal pulling apparatus includes a fixed heater, which cannot move during pulling of a silicon single crystal, so that oxygen concentration of the silicon single crystal decreases with the progress of pulling. To inhibit the decrease in oxygen concentration, rotational speed of the crucible is increased, however, this tends to degrade the oxygen concentration distribution in radial direction of the cross section of the silicon single crystal. In view of this, a silicon single crystal pulling apparatus disclosed in Patent Document 1 has configuration in which not only the crucible but also the heater can move vertically, thereby improving the oxygen concentration distribution in axis direction of a single crystal.

A silicon single crystal pulling apparatus disclosed in Patent Document 2 includes a moving mechanism capable of elevating and lowering a shield (heat insulating cylinder). After completion of pulling of a silicon single crystal, the shield is elevated, and then a region below the shield, which has been inside the shield, is exposed to a water cooled chamber to efficiently cool the interior of the water cooled chamber. Thus, this apparatus reduces the time required for cooling the chamber, thereby improving productivity.

CITATION LIST

Patent Literature

Patent Document 1: Japanese Unexamined Patent publication (Kokai) No. H03-5394

Patent Document 2: Japanese Unexamined Patent publication (Kokai) No. 2012-240861

SUMMARY OF INVENTION

Technical Problem

In the aforementioned single crystal pulling apparatuses, the crucible and the heater are vertically movable or the crucible and the shield are vertically movable, but both the heater and the shield are not vertically movable. Therefore, when a silicon single crystal is pulled while keeping height position of the melt surface constant, the positions of both the heater and the shield cannot be changed although the position of the heater or the shield can be changed alone relative to the crucible.

In addition, when a silicon single crystal is pulled, the position of the heater is changed relative to the position of the melt surface, whereby oxygen concentration of the silicon single crystal under pulling is controlled or thermal history of the silicon single crystal is adjusted. However, there are some problems in this regard. For example, if only the position of the heater is changed while the position of the shield is fixed, and thereby the position of shield becomes higher relative to the heater, heat insulating effect of the shield becomes too high to efficiently cool the silicon single crystal, consequently, the pulling rate cannot be sufficiently increased. If the position of shield becomes lower relative to the heater, heat insulating effect of the shield becomes too low to sufficiently heat an upper part of the melt, consequently, oxygen concentration of the silicon single crystal cannot be sufficiently reduced.

Moreover, an apparatus in which only the position of the shield is movable vertically while the position of the heater is fixed cannot control oxygen concentration of a silicon single crystal under pulling and adjust thermal history of a silicon single crystal, since the position of the heating center of the heater is not changed.

When a silicon single crystal pulling apparatus includes a mechanism for vertically moving not only a crucible and a heater but also a shield for the purpose of solving these problems, the structure is extremely complicated, which causes costly and easily malfunctioning silicon single crystal pulling apparatus.

The present invention was accomplished in view of the above-described problems. It is an object of the present invention to provide a silicon single crystal pulling apparatus that facilitates the adjustment of thermal history of a silicon single crystal, the improvement of pulling rate, and the reduction in oxygen concentration.

Solution to Problem

To achieve this object, the present invention provides a silicon single crystal pulling apparatus based on Czochralski method, comprising: a crucible for receiving a raw material; a heater for heating the raw material into a raw material melt; a main chamber accommodating the crucible and the heater; a shield disposed between the heater and the main chamber for shielding a radiant heat from the heater; and a supporting member holding the heater and the shield from below, the supporting member being movable vertically whereby the heater and the shield can move vertically together.

Such an apparatus enables the heater and the shield to move vertically together. Therefore, when the position of the heater is lowered to easily cool a silicon single crystal under pulling, the shield also can be lowered together, whereby the silicon single crystal can be easily cooled and the pulling rate can be accelerated, compared with the conventional apparatus. In addition, when the position of the heater is elevated such that the heating center of the heater is positioned at an upper portion of the melt, the shield also can be elevated together, whereby the heating center can be moved to a higher position and oxygen concentration of a silicon single crystal can be more reduced than the conventional apparatus. Furthermore, since the heater and the shield can be moved vertically just by moving vertically the supporting member, the mechanism can be simplified.

The supporting member may be composed of a vertically movable electrode and a clamp fixed on an upper part of the electrode, the electrode being capable of applying current to the heater, the heater being fixed and held by the clamp by inserting a plug provided on a leg of the heater into an upper surface of the clamp, the shield being fixed and held by the clamp through an insulator disposed on the upper surface of the clamp and a lower shield disposed on an upper part of the insulator, the electrode being vertically movable whereby the heater and the shield can move vertically together.

According to such a configuration, the heater and the shield can be moved vertically together only by the vertical-moving mechanism of the electrode, and thus it is unnecessary to separately provide an additional vertical-moving mechanism for the shield, besides the vertical-moving mechanism of the electrode. Moreover, the simple configuration combing the clamp, the lower shield, the insulator and so on, which are components inside the furnace, allows easy introduction of a low-cost silicon single crystal pulling apparatus in which the heater and the shield can move vertically together. Further, malfunction can be reduced because of the simple configuration.

The insulator may be made of quartz or alumina.

Such materials can inhibit the consumption of the insulator even when the clamp is heated during pulling of a silicon single crystal. Moreover, the lower shield and the shield can be kept in electrically insulating condition even when high current is applied to the heater. Consequently, the occurrence of a malfunction of the silicon single crystal pulling apparatus can be more reduced.

Advantageous Effects of Invention

The inventive silicon single crystal pulling apparatus facilitates the adjustment of thermal history of a silicon single crystal, the improvement of pulling rate, and the reduction in oxygen concentration, without complicating the apparatus configuration.

DESCRIPTION OF EMBODIMENTS

Hereinafter, embodiments of the present invention will be described, but the present invention is not limited to these embodiments.

A silicon single crystal pulling apparatus has a problem that when the positional relationship between the heater and the shield are changed from the initial position such that the respective height positions are different from each other, the apparatus fails to improve the pulling rate of a silicon single crystal to be grown and inhibit the oxygen concentration sufficiently. In addition, a silicon single crystal pulling apparatus in which both the heater and the shield are vertically movable causes problems of costly introduction and easily malfunctioning of the silicon single crystal pulling apparatus due to its extremely complicated configuration.

In view of this, the present inventors repeatedly and keenly conducted studies to solve the problems. Consequently, they found that when a heater and a shield are held by one supporting member that is vertically movable such that the heater and the shield can move vertically together, both the heater and the shield can be elevated and lowered while keeping the relative height position therebetween, whereby the above problems can be solved. Thus, they brought the present invention to completion.

Hereinafter, the inventive silicon single crystal pulling apparatus will be described with reference to FIGS. 1 and 2.

Figure 1:
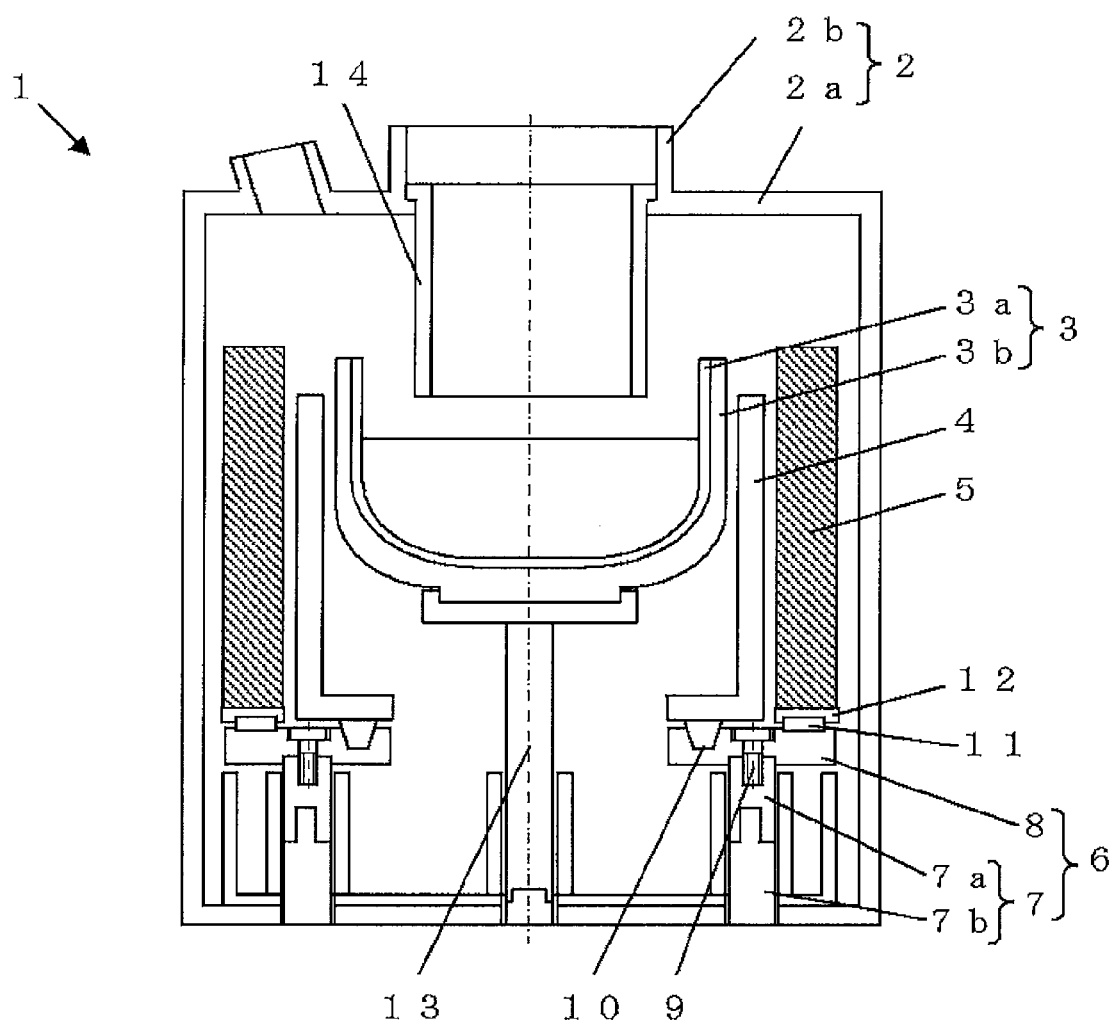
FIG. 1 is a schematic diagram showing an example of the inventive silicon single crystal pulling apparatus.

As shown in FIG. 1, the inventive silicon single crystal pulling apparatus 1 includes a hollow cylindrical chamber 2, giving an appearance. The chamber 2 is composed of a main chamber 2a constituting a lower cylinder and a pull chamber 2b constituting an upper cylinder continuously provided and fixed on the main chamber 2a. A gas flow-guide cylinder 14 having cylindrical shape and extending downward is continuously provided from a ceiling portion of the main chamber 2a, and the gas flow-guide cylinder has an aperture for leading a silicon single crystal.

A crucible 3 is arranged at a central portion of the hollow cylindrical chamber 2. The crucible has a double structure composed of a quartz crucible 3a and a graphite crucible 3b adapted to hold an outer side of the quartz crucible 3a. At a lower part of the crucible 3, a pedestal 13 for holding and rotating the crucible 3 is provided. The crucible 3 can be moved vertically by moving vertically the pedestal 13 during pulling of a silicon single crystal.

A heater 4 made of graphite is arranged at the outer side of the crucible 3 having the double structure, and a shield 5 made of a heat insulating material is concentrically arranged around the outer side of the heater 4. In the inventive silicon single crystal pulling apparatus, the heater 4 and the shield 5 are held by a supporting member 6 that is movable vertically. By vertically moving the supporting member 6, the heater 4 and the shield 5 can move vertically together.

Such an apparatus enables the heater 4 and the shield 5 to move vertically together when the heater 4 is vertically moved for adjusting thermal history and so on. Accordingly, as shown in FIG. 1, when the position of the heater 4 is lowered so as to easily cool a silicon single crystal under pulling, the position of the shield 5 also can be lowered together. Therefore, the inventive silicon single crystal pulling apparatus exhibits a better cooling efficiency, and thus the pulling rate of a silicon single crystal can be accelerated, compared with the conventional silicon single crystal pulling apparatus. Moreover, as shown in FIG. 2, when the heater 4 is elevated to position a heating center of the heater 4 at an upper portion of the melt, the shield 5 also can be elevated together. Therefore, the inventive silicon single crystal pulling apparatus enables the heating center to be higher position, and thus oxygen concentration of a silicon single crystal under pulling can be reduced, compared with the conventional silicon single crystal pulling apparatus.

Furthermore, since the positional relationship between the heights of the heater and the shield can be always kept during vertical movement of the heater and the shield, the problems such as unexpected deterioration of crystal quality and reduction in a ratio of obtaining a single crystal do not occur.

The structure of the supporting member for holding the heater and the shield from below is not particularly limited, but as shown in FIG. 1, the supporting member 6 is preferably composed of a vertically movable electrode 7 for applying current to the heater 4 and a clamp 8 made of graphite. The electrode 7 consists of a copper electrode 7b cooled with water and a graphite electrode 7a screwed and fixed to the copper electrode 7b. The electrode 7 has a vertical-moving mechanism, which enables the electrode 7 to move vertically. The clamp 8 is fixed to the graphite electrode 7a with a clamp bolt 9, and a plug 10 provided on a leg of the heater 4 is inserted into an upper surface of the clamp 8. In this manner, the heater 4 is fixed and held by the upper surface of the clamp 8. In addition, a circle- or ring-shaped insulator 11 is fit into the upper surface of the clamp 8, and a lower shield 12 is fit into an upper part of the insulator 11. The shield 5 is thus fixed to the clamp 8 through the insulator 11 and the lower shield 12. The supporting member 6 having the above structure preferably move the electrode 7 vertically, whereby the heater 4 and the shield 5 move vertically together.

According to this configuration, the heater 4 and the shield 5 can be moved vertically together only by a existing vertical-moving mechanism of the electrode 7, and thus it is unnecessary to separately provide an additional vertical-moving mechanism for the shield, etc., besides the vertical-moving mechanism of the electrode 7. Moreover, as mentioned above, the simple configuration combing the clamp 8, the lower shield 12, the insulator 11 and so on, which are components inside the furnace, allows easy introduction of a low-cost silicon single crystal pulling apparatus in which the heater 4 and the shield 5 can move vertically together. Further, the occurrence of a malfunction can be reduced because of the simple configuration.

The insulator 11 may be made of quartz or alumina.

Such materials can inhibit the consumption of the insulator 11 even when the clamp 8 is heated during pulling of a silicon single crystal. Moreover, the lower shield 12 and the shield 5 can be kept in electrically insulating condition even when high current is applied to the heater 4. Consequently, the occurrence of a malfunction of the silicon single crystal pulling apparatus can be more reduced.

EXAMPLE

Hereinafter, the present invention will be described in more detail with reference to examples of the present invention and comparative examples, but the present invention is not limited thereto.

Example 1

Pulling of a silicon single crystal was performed with the inventive silicon single crystal pulling apparatus 1 as shown in FIG. 1.

First, a quartz crucible having a diameter of 22 inches (55.88 cm) was filled with 100 kg of silicon polycrystalline raw materials and heated with the heater 4 to melt the materials. Then, as shown in FIG. 1, the supporting member 6 was lowered such that the upper end position of the heater 4 was below the upper end position of the crucible 3, the height positions of the heater 4 and the shield 5 were adjusted, and a silicon single crystal aimed at a diameter of 205 mm was pulled.

As a result, the silicon single crystal was pulled at a pulling rate of 1.4 mm/min, where the pulling rate is an average pulling rate when a straight body portion of the silicon single crystal was pulled. The oxygen concentration in the straight body portion after pulling was about 19 ppma±1.2 ppma (JEIDA).

Thus, it was demonstrated that when the heater and the shield were lowered together, the silicon single crystal under growing could be cooled efficiently, and the average pulling rate could be increased compared with comparative example 1, described later. The oxygen concentration in the straight body portion after pulling was in a range equal to comparative example 1, described later.

Comparative Example 1

Figure 3:
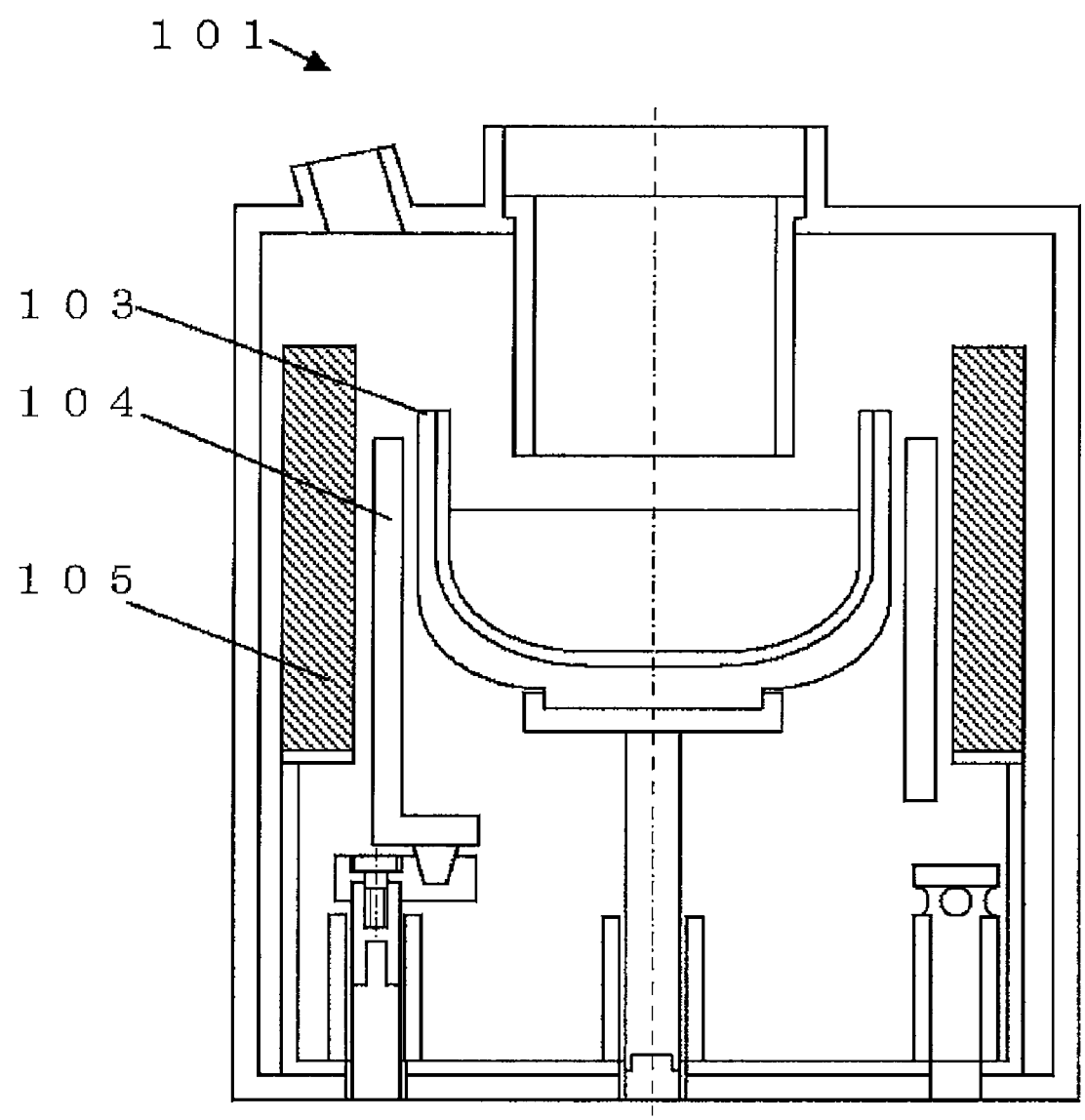
FIG. 3 is a schematic diagram showing of a conventional silicon single crystal pulling apparatus used in comparative example 1.

Pulling of a silicon single crystal was performed under the same condition as in example 1 except for using a silicon single crystal pulling apparatus 101 in which a heater 104 is movable vertically but a shield 105 is not movable vertically, as shown in FIG. 3. In this example, as shown in FIG. 3, the upper end position of the heater 104 was below the upper end position of the crucible 103, but the shield 105 was in a high position relative to the heater 104 since the shield 105 is not movable.

As a result, the average pulling rate when a straight body portion of the silicon single crystal was pulled was 1.1 mm/min, which was lower than the average pulling rate in example 1, described later. Moreover, the oxygen concentration in the straight body portion after pulling was about 19 ppma±1.2 ppma.

The reason is considered that since only the position of the heater was changed while the position of the shield was fixed, the position of the shield became higher relative to the heater, and the silicon single crystal cannot be efficiently cooled due to the heat insulating effect of the shield.

Example 2

Figure 2:
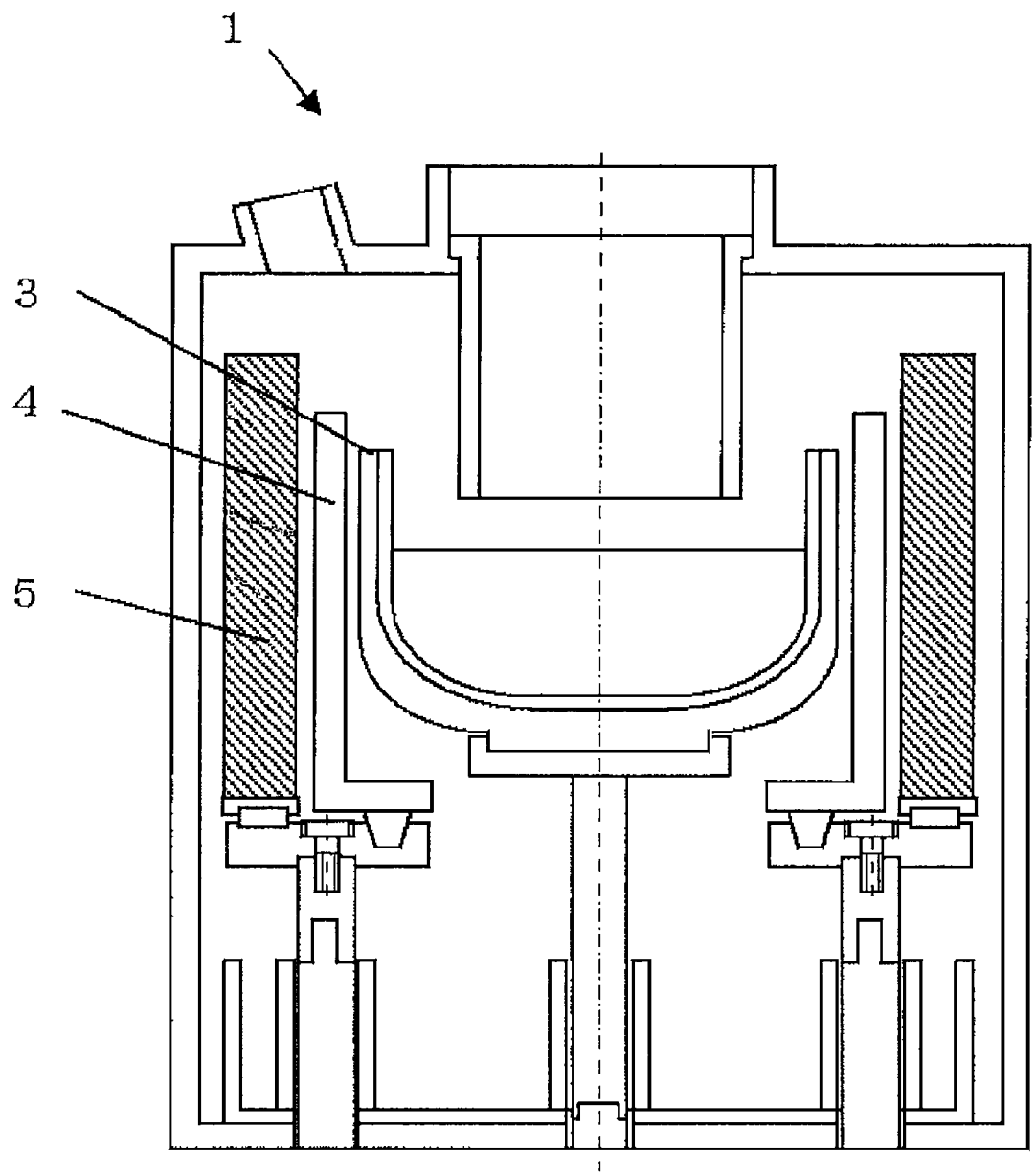
FIG. 2 is a schematic diagram showing an example of the inventive silicon single crystal pulling apparatus in which the heater position is changed.

Pulling of a silicon single crystal was performed under the same condition as in example 1 except that the heater 4 and the shield 5 were elevated together such that the upper end position of the heater 4 was above the upper end position of the crucible 3, as shown in FIG. 2.

As a result, the average pulling rate when a straight body portion of the silicon single crystal was pulled was 1.0 mm/min. Moreover, the oxygen concentration in the straight body portion after pulling was about 15 ppma±1.2 ppma, which was lower than the oxygen concentration in comparative example 2, described later.

Thus, when the heater 4 and the shield 5 were elevated together, the position of the shield 5 could be raised together, and the heating center of the heater 4 could be moved to a higher position. Accordingly, the oxygen concentration can be reduced compared with comparative example 2, described later. The average pulling rate was in a range equal to comparative example 2, described later.

Comparative Example 2

Figure 4:
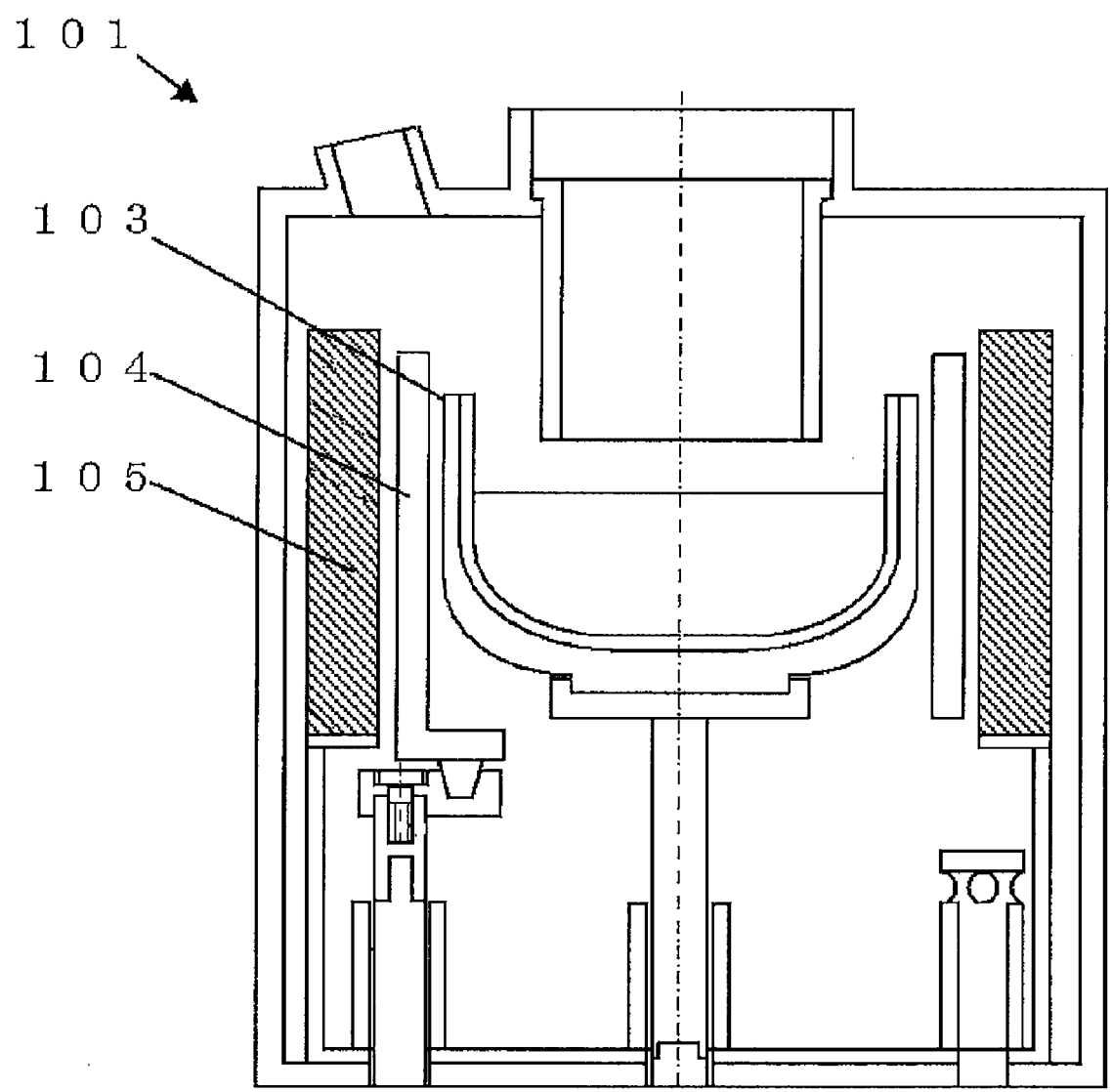
FIG. 4 is a schematic diagram showing of a conventional silicon single crystal pulling apparatus used in comparative example 2.

Pulling of a silicon single crystal was performed under the same condition as in example 2 except for using a silicon single crystal pulling apparatus 101 in which the heater 104 is movable vertically but the shield 5 is not movable vertically, as shown in FIG. 4. In this example, as shown in FIG. 4, the upper end position of the heater 104 was above the upper end position of the crucible 103, but the position of the shield 105 relative to the heater 104 was lowered compared with example 2 (case of FIG. 2) since the shield 105 is not movable.

As a result, the average pulling rate when a straight body portion of the silicon single crystal was pulled was 1.0 mm/min. Moreover, the oxygen concentration in the straight body portion after pulling was about 16 ppma±1.2 ppma, which was higher than the oxygen concentration in example 2.

The reason is considered as follows. Since the position of shield 105 is lowered relative to the heater 104, and the heat insulating effect of the shield was decreased, the upper part of the melt could not be heated efficiently, and thus the oxygen concentration of the silicon single crystal could not be reduced sufficiently.

From the above results, it could be understood that the inventive silicon single crystal pulling apparatus enables the heater and the shield to move vertically together, whereby the positions of the heater and the shield can be kept in appropriate positions, consequently enabling the improvement of pulling rate of a silicon single crystal and the reduction in oxygen concentration. In examples 1 and 2, the heater 4 and the shield 5, which are movable vertically together, were not moved vertically during pulling of the silicon single crystal. However, it is also possible to obtain a desired pulling rate and oxygen concentration of a silicon single crystal by appropriately changing and adjusting the height positions of the heater 4 and the shield 5 according to the condition of the silicon single crystal under pulling.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A silicon single crystal pulling apparatus based on Czochralski method, comprising:
   a crucible for receiving a raw material;
   a heater for heating the raw material into a raw material melt;
   a main chamber accommodating the crucible and the heater;
   a shield disposed between the heater and the main chamber for shielding a radiant heat from the heater; and
   a supporting member holding the heater and the shield from below, the supporting member being movable vertically whereby the heater and the shield can move vertically together,
   wherein the supporting member is composed of a vertically movable electrode and a clamp fixed on an upper part of the electrode, the electrode being capable of applying current to the heater, the heater being fixed and held by the clamp by inserting a plug provided on a leg of the heater into an upper surface of the clamp, the shield being fixed and held by the clamp through an insulator disposed on the upper surface of the clamp and a lower shield disposed on an upper part of the insulator, the electrode being vertically movable whereby the heater and the shield can move vertically together.

2. The silicon single crystal pulling apparatus according to claim 1, wherein the insulator is made of quartz or alumina.

* * * * *